United States Patent [19]
Yoshida et al.

[11] 3,935,485
[45] Jan. 27, 1976

[54] PIEZOELECTRIC KEY BOARD SWITCH

[75] Inventors: Masafumi Yoshida; Masahiro Segawa; Hiroshi Obara, all of Iwaki, Japan

[73] Assignee: Kureha Kagaku Kogyo Kabushiki Kaisha, Tokyo, Japan

[22] Filed: Sept. 17, 1974

[21] Appl. No.: 506,814

[30] Foreign Application Priority Data
Sept. 17, 1973 Japan.............................. 48-104681
Oct. 22, 1973 Japan.............................. 48-118801

[52] U.S. Cl. .................. 310/8.5; 310/8.3; 310/9.1; 340/365 A; 200/181
[51] Int. Cl.²......................................... H01L 41/04
[58] Field of Search .............. 310/8.3, 8.5, 8.6, 8.7, 310/9.1, 9.4; 340/365 A; 200/181

[56] References Cited
UNITED STATES PATENTS

| | | | |
|---|---|---|---|
| 3,240,885 | 3/1966 | Grunfelder et al. | 340/365 A |
| 3,303,290 | 2/1967 | Suloway | 340/365 A |
| 3,382,338 | 5/1968 | Arseneault et al. | 340/365 A |
| 3,503,031 | 3/1970 | Nyhus et al. | 340/365 A |
| 3,648,279 | 3/1972 | Watson | 310/8.3 |
| 3,798,473 | 3/1974 | Murayama | 310/8.3 |
| 3,832,580 | 8/1974 | Yamamuro | 310/8.6 |

*Primary Examiner*—Mark O. Budd
*Attorney, Agent, or Firm*—Sughrue, Rothwell, Mion, Zinn & Macpeak

[57] ABSTRACT

A key board switch comprising a multi-piezoelectric polymer film element A having, in the surface of the polymer film, a plurality of piezoelectric unit elements satisfying the following criteria: (a) the unit elements have electrodes on both surfaces thereof, (b) the portions of the polymer film of the piezoelectric unit elements held between the electrodes on both surfaces have piezoelectric properties and (c) any two piezoelectric unit elements are electrically independent of each other at least with respect to electrodes on one of the surfaces; and a substrate sheet B on which the polymer film element A is laid over and having windows or recesses in the positions corresponding to each of the piezoelectric unit elements of the polymer film element A. The key board switch is adapted so that those portions of the polymer film between each of the piezoelectric unit elements in the element A are secured to the substrate B at intermediate positions between the windows or recesses in the substrate B, whereby the stress applied to one of the piezoelectric unit elements is not transmitted to other adjacent elements so that the changes in the electric field generated from each of the piezoelectric unit elements can be an independent output.

16 Claims, 4 Drawing Figures

PIEZOELECTRIC KEY BOARD SWITCH

BACKGROUND OF THE INVENTION

1. Field of the Invention

This invention relates to a key board switch structure comprising as a stress transducer element a multiple-piezoelectric polymer film element having a plurality of piezoelectric unit elements provided on the surfaces of a polymer film and adapted so that the changes in the stress signals applied to the piezoelectric unit elements are converted into changes in piezoelectric electric field and taken out as the result of the switching operation.

2. Description of the Prior Art

The basic concept of a key board switch has already been proposed in Japanese Patent Laid Open Application No. 37244/72 wherein a multiple-piezoelectric polymer film element comprising a piezoelectric film, for example, of polyvinylidene fluoride rendered piezoelectric through polarization and a plurality of piezoelectric unit elements distributed in the film having electrodes on both surfaces of the films, with mechanical stress signals being applied to each of the unit elements to produce changes in the piezoelectric field some of the distributed elements and the changes in the piezoelectric field being used for signal input is described.

The example of the foregoing Japanese patent application discloses that when a stress is applied to a unit element of a key board switch, this stress is also transmitted more or less to other elements adjacent thereto resulting in a piezoelectric field but that such a piezoelectric field can easily be distinguished from the piezoelectric field generated from the unit element to which the stress is applied since the level of the former is usually on the order of one tenth of the latter. If the stress applied to the elements is always constant, the piezoelectric output from the unit element to which the stress is applied and the piezoelectric output from the other unit elements adjacent thereto can be distinguished and only the signals from the former unit can be utilized for input by cutting the electric field below this constant value. When the values of the stress are varied significantly as in the case of touching a push-button with one's finger, the piezoelectric field generated from a unit element by a low stress sometimes may be comparable to the piezoelectric field generated from the adjacent unit elements when a high stress is applied to the foregoing unit element, and such an electric field in this adjacent unit element forms undesirable noise.

SUMMARY OF THE INVENTION

A first object of this invention is to provide a basic structure of a key board switch comprising a multi-piezoelectric polymer film element in which the generation of noise from unit elements adjacent to the unit element to which a stress is applied can be avoided.

Since piezoelectric polymer films with deposited electrodes are extremely thin, the films are often torn or the electrodes tend to peel off the films and they are not suitable for frequent use.

A second object of this invention accordingly is to provide a key board switch capable of eliminating the foregoing defects in a structure in which the stress is indirectly introduced to the multi-piezoelectric polymer film element.

It is conceivable for indirectly applying the stress to the multi-piezoelectric polymer film element to cover the surface of the electrodes on the multi-piezoelectric polymer film with a protection sheet of considerable thickness such as of rubber, polyurethane or the like and apply the stress via this protection sheet. In this case, however, if the plurality of stress points are disposed on a protection sheet, the stress applied to one of them will be transmitted also to other adjacent points to cause noises.

A third object of this invention therefore is to provide a key board switch capable of eliminating the generation of noise where a multi-piezoelectric polymer film element is covered with a protective sheet.

This invention, accordingly, provides a key board switch comprising a multi-piezoelectric polymer film element a having in the surfaces of the polymer film, a plurality or piezoelectric unit elements satisfying the following conditions: a. the unit elements have electrodes on both surfaces thereof, b. the portions of the polymer film of said piezoelectric unit elements held between the electrodes on both surfaces have piezoelectric porperties and c. any two piezoelectric unit elements are electrically independent from each other at least with respect to electrodes on one surface; and a substrate sheet B on which the polymer film element A is laid and having windows or recesses in positions corresponding to each of the piezoelectric unit elements of the polymer film element A, and adapted so that those portions of the polymer film between each of the piezoelectric unit elements in the polymer element A are secured to the substrate B at positions intermediate between the windows or recesses in the substrate B so as to prevent a stress applied to one of the unit element from being transmitted to other unit elements whereby changes in the electric field generated from each of the piezoelectric unit elements can be an independent output.

BRIEF DESCRIPTION OF THE ACCOMPANYING DRAWINGS

These and other objects and advantages of this invention will be apparent from the following detailed descriptions of the specification and accompanying drawings.

DESCRIPTION OF THE PREFERRED EMBODIMENTS

Figure 1:
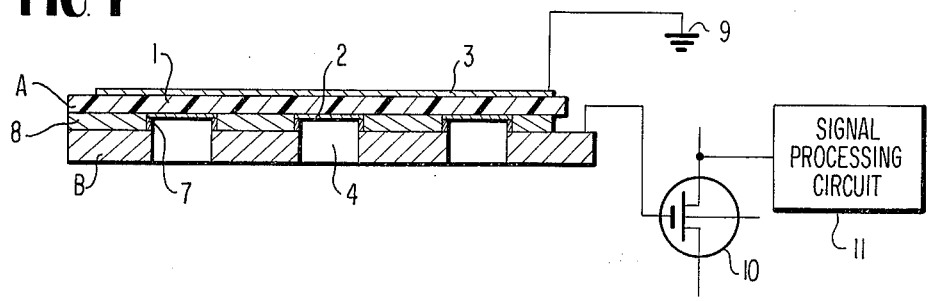
FIG. 1 is a cross sectional view of one embodiment of a key board switch according to this invention.

The key board switch according to this invention comprises the basic structure (a)–(c) as described below.

1. The mechanical stress-electric field transducer element of the switch according to this invention has a multipiezoelectric polymer film element A containing a plurality of piezoelectric units in a film that satisfy the following conditions (a)–(c).

a. The piezoelectric unit elements have electrodes on both surfaces thereof (those piezoelectric portions having electrodes only on one surface are not suitable).

b. The polymer films of the piezoelectric unit elements placed between the electrodes on both surfaces have piezoelectric characteristics (those portions not placed between the electrodes may have piezoelectric characteristics but such portions are excluded since signals are not delivered f changes in the piezoelectric field occur in these portions).

c. Any two piezoelectric unit elements placed between the electrodes on both surfaces are independent from each other at least with respect to their electrodes on one surface.

2. The multi-peizoelectric polymer multi-piezoelectric element as described above is placed over a substrate sheet B having recesses or windows in the positions corresponding to each of piezoelectric unit elements.

d. Films between each of the piezoelectric unit elements are secured to the windows or recesses at an intermediate position between the windows or recesses to the substrate so as to prevent a stress applied to one of the unit elements from being transmitted to other unit elements.

e. Electrical circuits are provided so that the changes in the electric field generated from each of the unit elements can be an independent output.

It is required that the piezoelectric unit elements according to this invention have the electrodes deposited on both sides thereof and at least the portion of the polymer film placed between the electrodes should have piezoelectric characteristics.

The polymer films can have uniform piezoelectric characteristics overall or they can be locally polarized and rendered piezoelectric in the portions for the piezoelectric unit elements. The piezoelectric element portions should have electrodes on both sides and those having electrodes only on one side are not suitable here. For example, they can be formed by depositing the electrodes substantially over the entire surface of one side of the piezoelectric polymer film and depositing other electrodes for the surface the other side in a spot like pattern, but the piezoelectric unit elements need be formed only in positions where the electrodes are deposited in this spot pattern. Similarly, where electrodes in a linear pattern are deposited on both surfaces of the film in such a manner that the electrodes on both surfaces cross each other, the piezoelectric unit elements need be formed only in these crossed portions.

Suitable electrodes include materials, for example, such as gold, platinum, silver, copper, aluminum, nickel, tin, and other conductive substances and they are applied to both surfaces of a higher polymer film using various means such as vapor deposition plating, printing, adhesion and the like.

The basic substrate sheet can be made providing the necessary windows or recesses in suitable materials such as metals, synthetic resins, rigid rubbers, wood, litho plates, concrete, plaster board and other like materials.

The insides of the windows or the recesses need not always be vacant and they can be filled with a liquid or a flexible solid substance such as foam rubber.

Any conventional means can be employed for securing the periphery of the piezoelectric unit elements to the substrate, such s adhesion and clamping so long as the stress, when applied to a unit element, is not delivered substantially to adjacent unit elements.

In order to facilitate a better understanding of this invention, the invention is described by way of preferred embodiments thereof referring to the accompanying drawings.

In FIG. 1, symbol A denotes a multi-piezoelectric polymer film element comprising a polar polymer film 1, for example, of polyvinylidene fluoride, having electrodes 2 in a spot like pattern on one surface thereof and electrode 3 completely over the other surface thereof by way of vapor deposition. The portions of the film at least between both of the electrodes are piezoelectric. The substrate B laid over the polymer film element A has windows 4 in the positions corresponding respectively to those positions of electrodes 2 deposited in the spot-like pattern and having a surface area slightly smaller than the surface area of the opposing electrodes. Electric contacts 5 are disposed in the periphery of the windows 4 for contact with the electrodes 2 exceeding the periphery of the windows and forming an electrical connection therewith when the polymer film element A and the substrate B are layered, and a printed circuit is provided between each of the electric contacts and terminals T correspondingly provided at the periphery of substrate B. Polymer film element A and substrate B are bonded together using adhesives, whereby the periphery of the spot electrodes and the electric contact 5 are bonded with electro-conductive adhesives 7 and ohter portions are bonded with insulating adhesives 8.

Polymer film A and substrate B can be joined only at the periphery of each window by the use of electroconductive adhesives only or they can be joined without using electroconductive adhesives by merely connecting them electrically through the contact in these portions. In the latter case, the electric contact between the contacts on substrate B and the periphery of the electrodes 2 contacted thereto should not be insulated by the insulating adhesives.

The printed circuit can be provided on the film element in place of on the substrate and, in this case, there is no need for an electrical contact between the polymer film element A and substrate B.

The device is grounded, for example by way of electrode 3 deposited over the entire surface at 9 in common and connected through each of the terminal T and by way of FET (field effect transistor) 10 to a signal processing circuit 11. When a stress is applied, for example, to $P_1$ of each of piezoelectric unit elements $P_1, P_2, \ldots P_9$, a piezoelectric field is generated at terminal $T_1$, which is sent to signal processing circuit 11 to perform the switching operation corresponding to the input signal from $P_1$. Since the periphery of electrodes 2 of piezoelectric polymer film element A is secured to substrate B with insulating adhesives, adjacent unit elements are free from each other with respect to the stress since they are separated at the intermediate portion therebetween, and a stress applied on one unit element is not be delivered to other unit elements $P_2, P_3, \ldots P_9$. Thus, no signals develop at the other terminal $T_2, T_3, \ldots T_9$. Where the periphery of the electrodes is not secured to that of the windows 4, a stress applied to $P_1$ causes changes in the piezoelectric field for the entire film element A since this is not insulated with respect to the stress and, therefore, piezoelectric signal noise is unevitably generated more or less at other adjacent unit elements such as $P_2, P_3, \ldots P_9$. etc.

Figure 3:
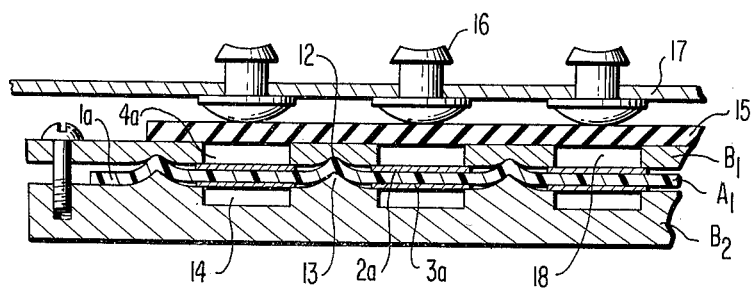
FIG. 3 is a cross sectional view for another embodiment of a key board switch according to this invention.

Another embodiment of the basic structure of the key board switch according to this invention is shown in FIG. 3, wherein a multi-piezoelectric polymer film element $A_1$ is composed of a piezoelectric polymer film 1a having spot electrodes 2a and 3a deposited respectively on both surfaces thereof. A substrate $B_1$ is shown having windows 4a apertured therethrough and small recesses 12 provided on the under surface thereof for securing the polymer film at the intermediate position between each of the unit elements, and a presser substrate $B_2$ has projections 13 in the positions corresponding to these recesses 12 and deep recesses 14 in the positions corresponding to the windows 4a in the substrate $B_1$. The polymer film element $A_1$ is held between and thereby secured to substrate $B_1$ and $B_2$ and, as a result, each of the unit elements and other unit elements adjacent to it are separated at the intermediate position between them with respect to the applied stress.

The key board switch shown in FIG. 1 or that comprising the basic structure only composed of the combination of $B_1 - A_1 - B_2$ shown in FIG. 3 can operated with the fingers and other means for applying a stress but when a hard stress application means is directly contacted to the electrodes, the electrodes tend to be damaged or the polymer film tend to be torn.

The key board structure shown in FIG. 3 is constructed so that the stress can be transmitted to each of the unit devices by way of a fluid medium while avoiding a direct contact by the stress application means to the electrodes. In FIG. 3 reference numeral 15 denotes a flexible rubber sheet or synthetic resin film attached to the upper surface of the substrate $B_1$ by adhesion or other suitable means. 16 designates pushbuttons and 17 is a outer cover of the switch panel. As can be seen from drawing, each of the windows 4a in the substrate $B_1$ is closed at both end faces thereof with polymer film $A_1$ and sheet 15 and forms a reservoir for the operation fluid. As the operation fluid, air confined within said windows 4a is usually used but other gaseous or liquid tightly sealed therein media can be used. They are adapted so that the actuation of a pushbutton switch 16a depresses the sheet located beneath the button and generates a fluid pressure within the recesses 18, resulting a piezoelectric field.

In place of pressing the sheet 15 as shown in FIG. 3, the switching operation can also be performed by providing additional fluid conduits from reservoirs (not shown) for the operation fluid and causing the fluid pressure in the conduid to change and the sheet 15 need not be flexible in this case.

A thin protection coating can be applied on the surface of the electrodes as another way for avoiding a direct contact of a means whereby a hard stress is applied to the multi-piezoelectric polymer film element. This is extremely advantageous since such a coating can protect the electrodes not only against abrasion but also against moisture and corrosive atmospheres and it can be applied of desired, also to the elements of the key board switch shown in FIG. 1 to FIG. 3. It is, however, noted that the thickness of the coating should be restricted appropriately so that polymer film can be deformed by a small stress.

Where the multi-piezoelectric polymer film element should be protected against greater mechanical shock, the polymer film can be covered with a flexible shock absorber sheet such as, for example, of rubber, foamed polyurethane, soft polyvinylchloride, polyethylene, etc. and the stress is applied to the polymer film element through this shock absorber sheet. In the key board switch, for example, shown in FIG. 3, such a shock absorber material can be substituted for the operation fluid within the windows 4. The simplest key board switch structure employing the shock absorber sheet is shown in FIG. 4, wherein a multi-piezoelectric polymer film element is covered with a shock absorber sheet of about the same size.

Figure 4:
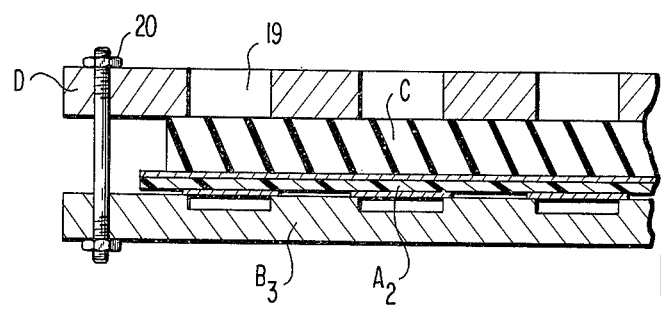
FIG. 4 is a cross sectional view for still another embodiment of a key board switch according to this invention.

In FIG. 4, a multi-piezoelectric polymer film elements $A_2$ similar to the polymer film A in FIG. 1 is composed of a piezoelectric polymer film having spot electrodes on the lower surface and an over all electrode on the upper surface thereof respectively, applied by vapor deposition. A substrate $B_3$ has recesses in the positions corresponding to the spot electrodes and printed circuits are formed either on the polymer film element $A_2$ or on the substrate $B_3$. C is a flexible shock absorber sheet made, for example, of rubber, foamed polyurethane, etc. and D is a holding plate having operation windows 19 in positions corresponding to each of the piezoelectric unit elements. The embodiment shown is so adapted that by clamping $B_3$ and D with a B.S. thread 20, the periphery of each of the piezoelectric unit elements and the portions of the shock absorber material situated thereover are secured to the substrate $B_3$ and the peripheral area around the windows 19 in sheet D thereby separating the piezoelectric element and other adjacent elements from each other with respect to the stress, that is, the stresses applied to these elements are not transmitted between each other.

The multi-piezoelectric polymer film element used in this invention can be selected from piezoelectric films such as mono- or bi-axially oriented poly-$\gamma$-methylglutamate film, or those films that are not piezoelectric as molded but can be entirely or partially rendered piezoelectric through polarization under a high static electric field such as polyvinylfluoride, polyvinylidene fluoride, etc. and such polymer films can be provided with the required electrodes on both surfaces thereof. Films having thereon printed circuit let from the electrodes can be used if desired.

For the piezoelectric polymer film, a higher piezoelectricity is desired since it provides higher sensitivity and facilitates noise separation. The piezoelectric polymer film having the highest piezoelectric property includes vinylidene fluoride polymers or copolymers consisting of vinylidene fluoride as an essential ingredient and a monomer or monomers copolymerizable therewith such as tetrafluoroethylene, trifluoroethylene, trifluoromonochloroethylene, fluorochlorovinylidene, vinyl fluoride, hexafluoropropylene, ethylene, propylene and the like. Such polymer films are stretched and oriented to provide a $\beta$-type crystal structure and then subjected to polarization under a high static electric field below the withstand voltage of the film at a temperature above about 40°C and below the melting point of the film to result in a piezoelectric constant $d_{31}$ at least about $1 \times 10^{-8}$ cgsesu ($1 \times 10^{-8}$ cgsesu to $2 \times 10^{-6}$ cgsesu).

The multi-piezoelectric polymer film element can be formed by polarizing a polymer film between a pair of polarization electrodes to produce piezoelectric polymer film and attaching thin film electrodes thereon by printing, adhesion and the like. Alternatively, the polymer film element can be formed by providing the necessary switching electrodes on the polymer film prior to the polarization by vapor deposition, plating, printing, etc. and then polarizing by utilizing the electrodes as both electrodes for the polarization. Further, electrodes can be previously formed substantially over the entire surfaces of both sides of the films while leaving some margins around one or both surfaces so as to avoid short-circuit failures between both electrodes and, after the polarization, the electrodes on one both surfaces of the polymer films are partially removed to form stripe like or spot like electrodes.

Where the polymer film is excessively thin, a unifom thick film can not be obtained easily, often causing damage due to the high voltage applied in the polarization, which decreases the yield in the polarization. If the polymer film is too thick, the ratio of deformation vs stress of the film is reduced and the application of a larger stress results in the transmission of that stress to adjacent unit elements causing disadvantageous noise. The preferred film thickness is in the range of about 3 $\mu$ to 200 $\mu$, with the range of 10 $\mu$ to 100 $\mu$ being particularly preferred.

The thickness of the electrodes can be optionally selected so long as the electrodes conduct the current and allow the film to deform easily. Since the current flow through them is very small, even thin electrodes, for example, consisting of a transparent gold film with a thickness of less than about 100 $\mu$ and formed by vapor deposition can be used satisfactorily. An electroconductive adhesive tape of a thickness of about 35 $\mu$ laminated in two layers can also be used without difficulty.

The substrate sheet can be made of various materials without restriction provided that the sheet is not deformed by the application of the stress. These materials can be selected for the sake of electrical convenience, that is, where the substrate contacts the surface of the film on which the electrodes is provided overall, it may be convenient to use a metallic substrate and lead the substrate to the ground, and where the substrate contacts the surface on which the spot electrodes are provided, the substrate desirably is made of an insulating material or of a metal coated with an insulating material.

The thickness of the substrate is so selected that the substrate can be formed with windows or recesses therein which are deep enough to allow the film to extend locally and move freely perpendicular to the surface of the film when a stress is applied to the unit elements in the multi-piezoelectric polymer film element. Usually a thickness of more than about 100 $\mu$ is required on considering the strength but where the polymer film is deformed by a fluid medium as shown in FIG. 3, it may be on the order of several tens of microns since the displacement of the film is small.

The size and the pitch of the windows or recesses provided in the substrate can be easily determined by those skilled in the art depending upon the structure and use of the key board switch. For example, for the embodiment to be operated with the fingers and pushbuttons, the windows or the recesses suitably have the size of about 5 mm to 30 mm and a pitch from about 1 mm to 50 mm, and for the embodiment operated by a fluid operated device they can have a smaller aperture diameter and pitch.

In addition to the printed circuit, FET, diodes, resistors, capacitors and the like can also be mounted on the substrate.

The key board switch of this invention can be assembled easily since it can be achieved merely by securing the multipiezoelectric polymer film element to the substrate and the cost for the wiring operation can be reduced significantly because the wiring from the film element to the terminals can be completed together with the assembly of the key board switch by providing a printed circuit either on the polymer film element or on the substrate. Moreover, since the switching operation is conducted without using electrical contacts, no spark difficult and the like occur at the time of contact and stable switching function for a prolonged period can be achieved.

The invention is further illustrated by reference to the following example.

EXAMPLE

A monoaxially oriented polyvinylidenefluoride film of a thickness of 20 $\mu$ was provided with an aluminum electrode entirely over one surface through vapor deposition and in a spot pattern, having a diameter and pitch both of 10 mm, on the other surface through vapor deposition and a static electric field of 1.2 KV (electric field intensity 600 KV/cm) was applied to the film having the deposited aluminum electrodes across the electrodes on both surfaces for 30 minutes in a thermostatically controlled bath. Thereafter, it was allowed to cool to room termperature (about 20°–30°C) while applying the above static electric field and then the electric field was removed. The film had a piezoelectric constant $d_{31}$ of $5 \times 10^{-7}$ cgsesu only in the portions to which the electric field had been applied.

Figure 2:
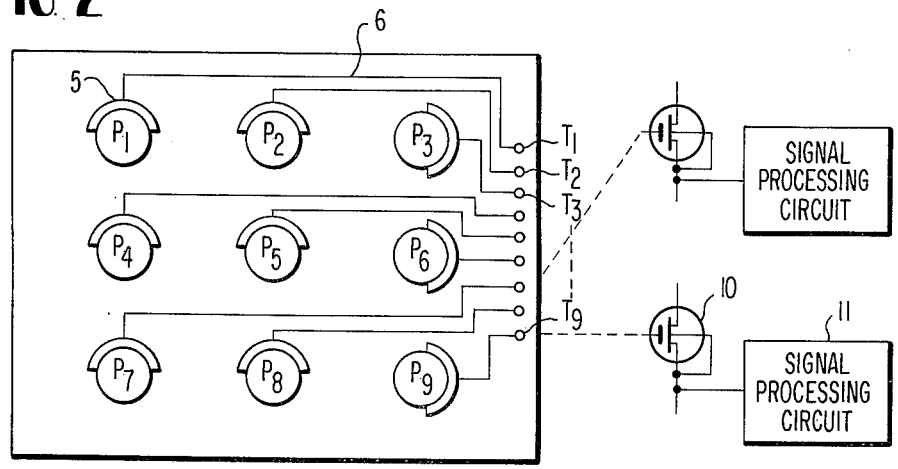
FIG. 2 is a plan view for a substrate of the key board switch shown in FIG. 1.

The multi-piezoelectric polymer film element using, as the pizoelectric portion, the foregoing polarized polyvinylidenefluoride was assembled as shown in FIG. 1 to a substrate a thickness of 2 mm having windows of a diameter of 8 mm in positions corresponding to the spot electrodes of the multipiezoelectric polymer film elements and provided with printed circuits as shown in FIG. 2. On touching a piezoelectric unit element over a window, an accute electric field of a signal having a peak of 1 to 30 volts developed in the corresponding terminal whereby no piezoelectric changes were found in the terminal corresponding to the adjacent unit elements.

The over all surface of the under side of the key board substrate was coated with adhesives and a 20 $\mu$ thick polyester film was bonded over it. On slightly touching the window portion from the side of the polyester film, an acute electric field of a signal of 100 to 1000 mV developed to the terminal.

As a comparison example, a key board switch was assembled by forming a multi-piezoelectric polymer film element through the polarization of the same polyvinylidenefluoride film as above except that additional circuit wiring was provided from each of the spot electrodes to the side margins in the printed circuit. The periphery of the polymer film element was then bonded and secured to the frame and merely laid over the substrate with the windows. On slightly touching one of the unit elements of the key board switch an electrical field of 1.2V developed at the corresponding terminal accompanied by an electric field of 50 to 90mV developed at the terminals corresponding to the adjacent unit elements. Then, on touching the same unit element with a somewhat greater stress, the corresponding terminal showed an electrical field of about 8V accompanied by an electric field of 0.7 to 1.8 volts at the terminals corresponding to the adjacent unit elements.

While the invention has been particularly shown and described with reference to a preferred embodiment thereof, it will be understood by those skilled in the art that various changes in form and details may be made therein without departing from the spirit and scope of the invention.

What is claimed is:

1. A key board switch comprising
a polarized polymer film element A having in the surface of the polymer piezoelectric film, a plurality of piezoelectric unit elements satisfying the following condition:
   a. said unit elements have electrodes on both surfaces thereof,
   b. the portions of the polymer film of said piezoelectric unit elements held between the electrodes on both surfaces have piezoelectric properties and
   c. any two piezoelectric unit elements are electrically independent from each other at least with respect to electrodes on one surface; and
a substrate sheet B on which the polymer film element A is laid and having windows or recesses in positions corresponding to each of the piezoelectric unit elements of the polymer film element A, those portions of the polymer film between adjacent piezoelectric unit elements in the polymer element A being secured to the substrate B at positions between the windows or recesses in the substrate B so as to prevent a stress applied to one of the unit elements from being transmitted to another unit element whereby changes in the electric field generated from each of the piezoelectric unit elements can be an independent output.

2. The key board switch as defined in claim 1, wherein the polymer film element and the substrate are bonded with adhesives.

3. The key board switch as defined in claim 1, further comprising another substrate sheet overlying and secured to the polymer film element.

4. The key board switch as defined in claim 1, wherein each of the piezoelectric unit elements laid over a window forms a reservoir for an operation fluid, and the switch is adapted to operate by the changes in the pressure of said operation fluid.

5. The key board switch as defined in claim 1, including a shock absorber sheet and held between and secured to a presser substrate and another substrate having operation windows in the positions corresponding to each of the piezoelectric unit element covering the polymer film element.

6. The key board switch as defined in claim 1, including a common electrode substantially for the entirety of one surface of the polymer film element and electrodes in a spot pattern electrically independent from each other on the other surface of the polymer film element.

7. The key board switch as defined in claim 1, including electrodes in a spot pattern electrically independent from each other on both surfaces of the polymer film element.

8. The key board switch as defined in claim 1, including band shaped electrodes in a stripe pattern on both surfaces of the polymer film element in such a manner that the stripes on both surfaces cross each other.

9. The key board switch as defined in claim 1, wherein the polymer film element is piezoelectric over its entire surface.

10. The key board switch as defined in claim 1, wherein the polymer film element is locally piezoelectric only in the portions that form each of the piezoelectric unit elements.

11. The key board switch as defined in claim 1, including a common electrode substantially for the entirety of one surface on the polymer film and electrodes in a spot pattern electrically independent of each other on the other surface of the polymer film, a common electrode grounded as a common buss and each of the electrodes in a spot pattern being provided with respective wiring leading to the outside by way of an FET.

12. The key board switch as defined in claim 1, including a common electrode substantially for the entirety of one surface of the polymer film element A opposed to the substrate and electrodes in a spot pattern electrically independent of each other on the other surface of the polymer film element A, the contacts electrically connected to the electrodes in a spot pattern on the polymer film element A being provided on the periphery of each of the windows of recesses in the substrate laid over the electrodes in a spot pattern and each of said contacts being provided with printed circuits leading to the terminals at one end of the substrate.

13. The key board switch as defined in claim 12, wherein said printed circuits include diodes, FETs and/or resistors.

14. The key board switch as defined in claim 12, wherein each of the terminals is connected by way of an FET to signal processing circuits.

15. The key board switch as defined in claim 1, wherein the polymer film is vinylidenefluoride having a $\beta$-type crystal structure.

16. The key board switch as defined in claim 1, wherein the polymer film element comprises a copolymer film of vinylidenefluoride as an essential component and a monomer or monomers copolymerizable therewith having a $\beta$-type crystal structure.

* * * * *